(12) United States Patent
Lim

(10) Patent No.: US 8,523,591 B2
(45) Date of Patent: Sep. 3, 2013

(54) HAND SOCKET LID

(75) Inventor: Chia Seong Lim, Kedah Darul Aman (MY)

(73) Assignee: Test Tooling Solutions (M) Sdn Bhd, Bayan Lepas, Penang (MY)

( * ) Notice: Subject to any disclaimer, the term of this patent is extended or adjusted under 35 U.S.C. 154(b) by 12 days.

(21) Appl. No.: 13/221,385

(22) Filed: Aug. 30, 2011

(65) Prior Publication Data

US 2012/0052706 A1 Mar. 1, 2012

(30) Foreign Application Priority Data

Aug. 30, 2010 (MY) .......................... PI 2010004083

(51) Int. Cl.
*H01R 13/62* (2006.01)
(52) U.S. Cl.
USPC ......................................................... 439/331

(58) Field of Classification Search
USPC ....... 439/331; 324/756.01, 756.02; 361/704, 361/709, 710
See application file for complete search history.

(56) References Cited

U.S. PATENT DOCUMENTS 6,731,504 B1 * 5/2004 Liu .............................. 361/704

* cited by examiner

*Primary Examiner* — Phuong Dinh
(74) *Attorney, Agent, or Firm* — Hamre, Schumann, Mueller & Larson, P.C.

(57) ABSTRACT

The present invention relates generally to a hand socket lid mounted on a test contactor for use in compressing electronic devices such as integrated circuit (IC) package in high pin counts that employs high force to the contact part of the hand socket lid to the said device located in the test contactor to obtain a stable electrical connection between the terminals of an electronic device through the test probe mounted in the test contactor on a printed circuit board without causing pain to the user's hand effecting the said high force.

16 Claims, 4 Drawing Sheets

US 8,523,591 B2

HAND SOCKET LID

1. TECHNICAL FIELD OF THE INVENTION

The present invention relates generally to a hand socket lid mounted on a test contactor for use in compressing electronic devices such as integrated circuit (IC) package in high pin counts that employs high force to the contact part of the hand socket lid to the device located in the test contactor to obtain a stable electrical connection between the terminals of an electronic device and a printed circuit board through the test probe located in the test contactor without causing pain to the user's hand effecting the said high force.

2. BACKGROUND OF THE INVENTION

A test contactor is often required to receive an electronic device such as an integrated circuit (IC) package and enable electrical connection between the lead terminals of an IC package and a printed circuit board on which the contactor is located so that the IC package may be tested prior to permanent installation of the said package by soldering to the printed circuit board. To afford such connectivity the contact part of the hand socket lid mounted on the test contactor is used to compress onto the IC package with high compression force in order to eliminate as much crevices forming between contacting parts as possible since the presence of the crevices causes loose connection and hence unreliable results during testing. Further the high compression force that is manually effected by the user by means of levers attached to the hand socket lid of the test contactor causes much pain to the users' hand and it is not ergonomic.

The above drawback can be overcome by having a high force hand socket lid that has a bearing integrated therein that helps to reduce friction and hence allowing smoother contact between two contact surfaces that is the edge of the lever of the hand socket lid and the periphery of the bearing so as to alleviate the effects of pain to the user's hand when high compression force is being exerted on the contact part of the hand socket lid of the test contactor by means of the said lever.

3. SUMMARY OF THE INVENTION

Accordingly, it is the primary aim of the present invention to provide a hand socket lid wherein a high compression force is capable of being effected onto the device of the test contactor merely by means of a single hand of the user actuating the lever attached to the hand socket lid.

It is yet another object of the present invention to provide a hand socket lid wherein friction is reduced to allow smoother contact between two contact surfaces enabling high compression force to be effected by a single hand pain-free.

Yet another object of the present invention is to provide a hand socket lid wherein a compression force of over one hundred kilogrammes of force (kgf) can be single handedly effected by a user without experiencing pain.

It is yet another object of the present invention to provide a hand socket lid which is simple in design, requires less components to assemble, does not require any jigs during the assembly process and is cost effective.

Yet a further object of the present invention is to provide a hand socket lid wherein high compression force can be effected onto the hand socket lid of the test contactor even on high pin-count packages testing.

It is a further object of the present invention to provide a hand socket lid which is versatile as it is provided with an adjustable pedestal or heatsink by pushing down the device to cater for the different thickness with same pin map configuration design of electronic devices including IC packages to suite the customers' test floor.

It is a further object of the present invention to provide a hand socket lid with a latching device to prevent the accidental opening of the latch during the test mode (compression mode) [also known as the Poka-Yoke concept] which can affect the testing process.

Other and further objects of the invention will become apparent with an understanding of the following detailed description of the invention or upon employment of the invention in practice.

According to the preferred embodiment of the present invention there is provided, A hand socket lid (8) for use in compressing electronic devices (4) mounted on a test contactor (2) comprising;

at least a compressing mechanism (10) having at least a lever member (10A)

characterised in that the said compressing mechanism (10) is provided with at least a bearing member (10B) having its periphery that comes into contact with the periphery of said lever member (10A) when the compressing mechanism (10) is in a compression mode.

4. BRIEF DESCRIPTION OF THE DRAWINGS

Other aspect of the present invention and their advantages will be discerned after studying the Detailed Description in conjunction with the accompanying drawings in which.

5. DETAILED DESCRIPTION OF THE DRAWINGS

In the following detailed description, numerous specific details are set forth in order to provide a thorough understanding of the invention. However, it will be understood by those of ordinary skill in the art that the invention may be practiced without these specific details. In other instances, well known methods, procedures and/or components have not been described in detail so as not to obscure the invention.

The invention will be more clearly understood from the following description of the embodiments thereof, given by way of example only with reference to the accompanying drawings, which are not drawn to scale.

Figure 1:
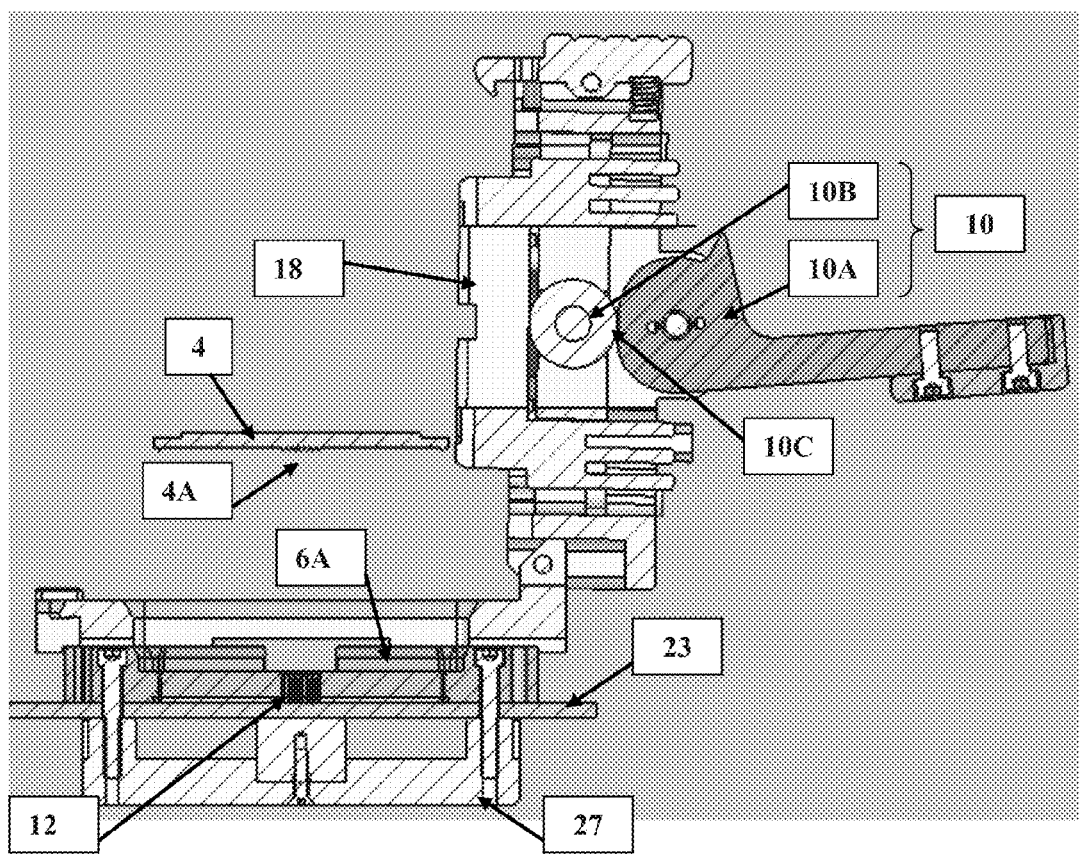
FIG. 1 shows a sectional view of the hand socket lid in opened position for packaging loading.
Figure 2:
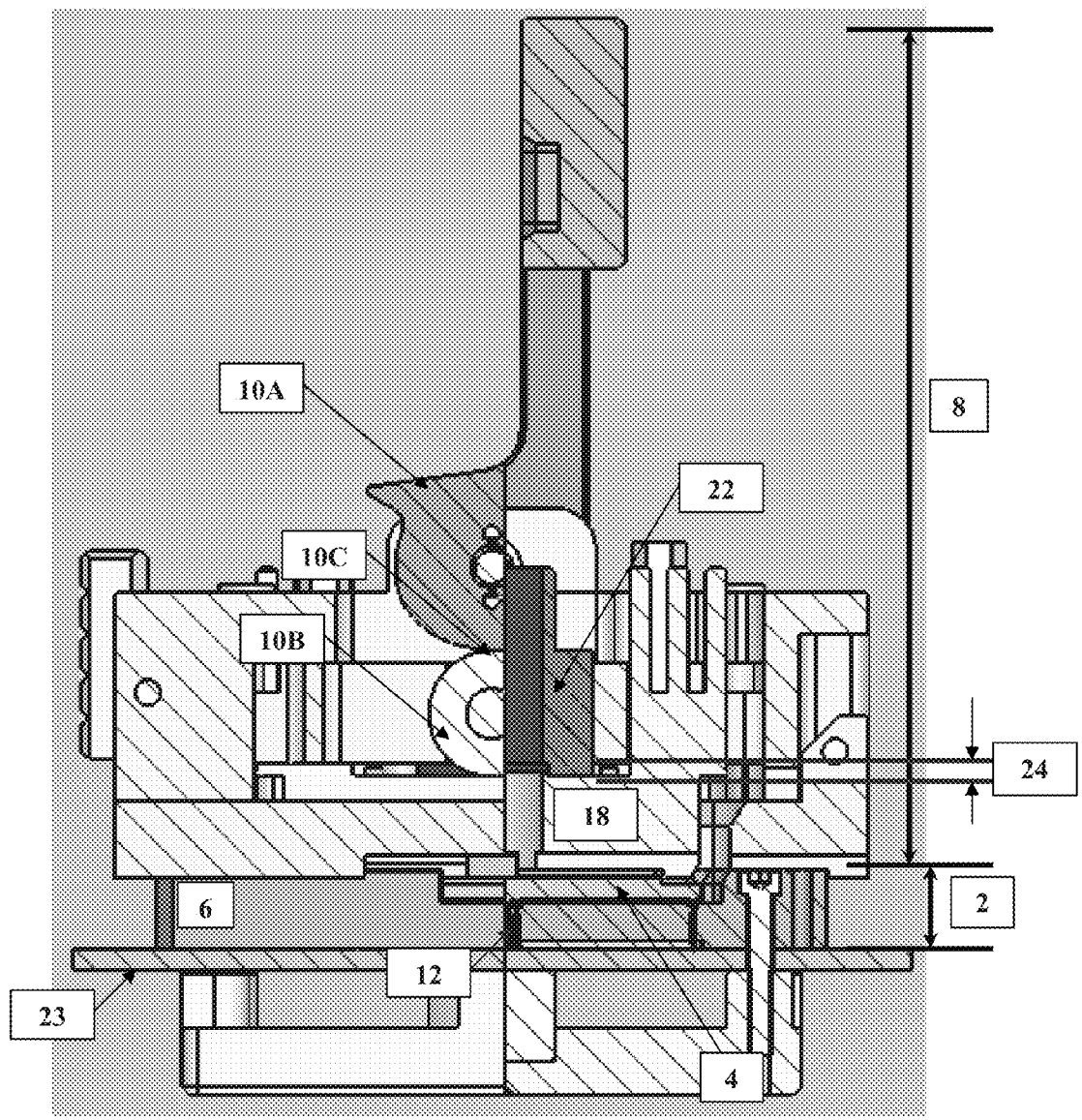
FIG. 2 shows a sectional view of the hand socket lid mounted to a test contactor on a printed circuit board before the compression mode.
Figure 3:
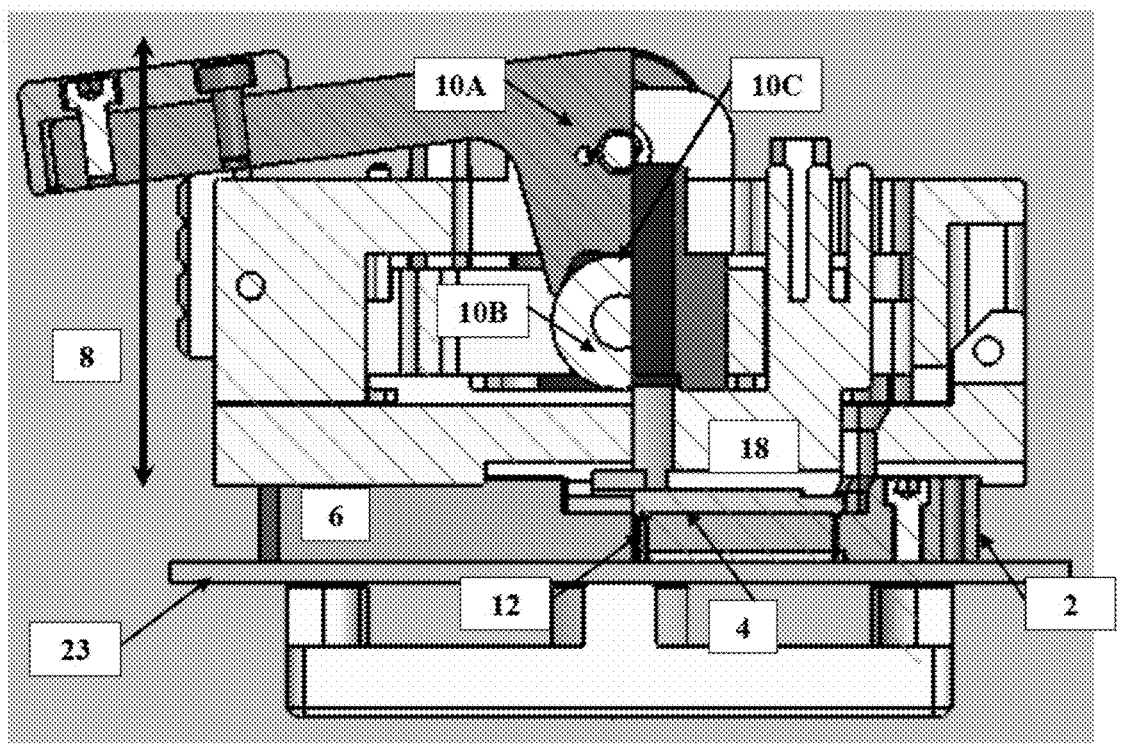
FIG. 3 shows a sectional view of hand socket lid mounted to a test contactor on a printed circuit board during compression mode.

Referring now to FIGS. 1 to 3, FIG. 1 shows a sectional view of the hand socket lid (8) in opened position for packaging loading, FIG. 2 shows a sectional view of the hand socket lid mounted to a test contactor (2) situate on the printed circuit board (23) before the compression mode and FIG. 3 shows a sectional view of the hand socket lid (8) mounted to a test contactor (2) on the printed circuit board (23) during compression mode. The said hand socket lid (8) is provided with at least a compressing mechanism (10) and is moveably mounted or attached to a test contactor (2). The test contactor (2) includes at least a contactor body (6) provided with at least a cavity (6A) to accommodate the electronic device (4) preferably an IC package and a plurality of openings disposed therein for receiving contacts or test probe (12). The compressing mechanism (10) consist of at least a pressing member (18) [preferably a heatsink or pedestal or the like] and at least a lever member (10A) having one of its end attached to the hand socket lid (8) enabling compression of the IC package (4) when the said hand socket lid (8) is lowered to meet the contactor body (6) by lowering the said lever member (10A). This downward movement of the lever member (10A) will be transmitted to the pressing member [preferably a heatsink or pedestal or the like] (18) thus moving the said pressing member [preferably a heatsink or pedestal or the like] (18) towards the cavity (6A) containing the IC package (4) which in turn pushes the IC package (4) towards the base of the cavity (6A) located therein the contactor body (6) to facilitate good contact between lead terminal (4A) of the IC package (4) with the contacts or test probe (12) during testing. The compression spring (not shown) that is integrated in the contacts or test probe (12) will have a return force against the downward direction of movement. Higher pin-count IC packages tend to produce a higher force against the lever movement of the compression mechanism (10) thereby requiring the user to apply higher force to perform compression thus resulting in the user experiencing pain in the hand when exerting the said force onto the said hand socket lid (8) of the test contactor (2). In the preferred embodiment illustrated in more detail in FIGS. 1 and 2, the compressing mechanism (10) is further provided with at least a bearing member (10B) where the periphery of the bearing member (10B) comes into contact with the periphery of the said lever member (10A) when the compressing mechanism (10) is in a compression mode, that is when the said hand socket lid (8) meets the contactor body (6) by lowering the said lever member (10A). The utilisation of the bearing member (10B) at the contacting surface (10C) between the periphery of the bearing member (10B) and the periphery of the said lever member (10A) assists to reduce frictional force thereby promoting smoothness in movement, thus the user does not have to exert such a great force to perform the same compression task as when there is no usage of the bearing member (10B). As a result, the pain in the hand experienced by the user is solved even if only one hand is used to carry out the compression task. The present invention has helped to allow a pain-free high force compression task to be carried out using only one hand. Preferably a stiffener (27) is provided to prevent warpage of the printed circuit board (23).

Figure 4:
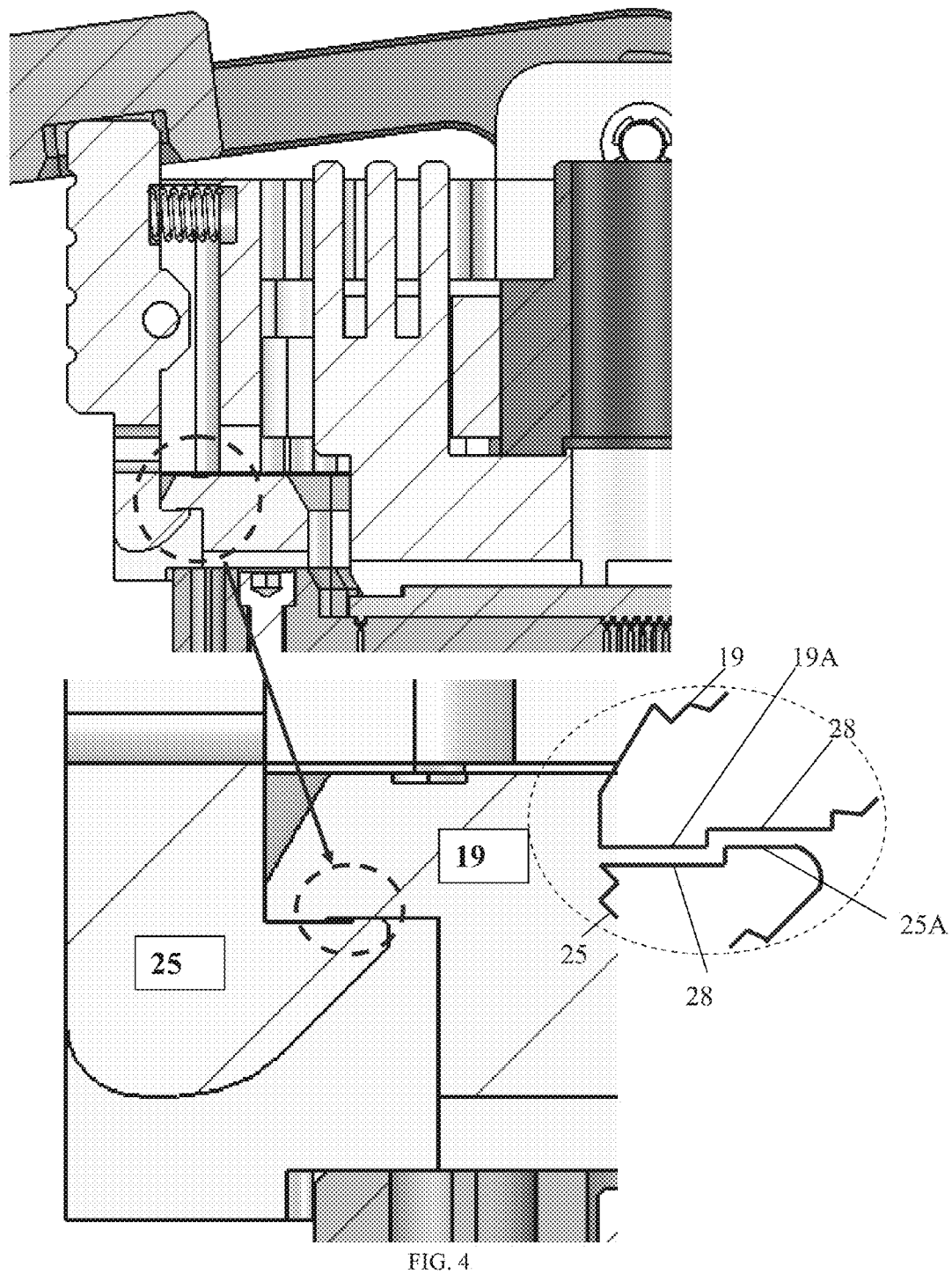
FIG. 4 illustrates a sectional view of the latching device provided to the hand socket lid of the present invention.

The hand socket lid (8) has to be securely engaged to the contactor body (6) during compression or test mode so that the hand socket lid (8) is not accidentally opened as this will affect the testing process. It is hence extremely important that a reliable latching mechanism is provided to the hand socket lid (8) of the present invention for security reasons during the compression mode. Referring now to FIG. 4, there are shown sectional views of a latching device (25) being secured to the plate (19) of the hand socket lid (8) of the present invention and an enlarged view of same. The latching device (25) is preferably hook-like in configuration and is provided with at least a groove (28) adjacent to its end (25A) contacting the plate (19) of the hand socket lid (8) which preferably has a configuration akin to a clamshell. The said plate (19) of the hand socket lid (8) is provided with at least a protruded portion (19A) at the part to engage the latching device (25). The engagement of the said plate (19) of the hand socket lid (8) by means of at least a protruded portion (19A) with at least a groove (28) of the latching device (25) is such that the said groove (28) on the of the latching device (25) complements the said protrusion (19A) on the said plate (19) so that when engaged both will complementarily abut each other securely and will not be easily opened.

In another embodiment the hand socket lid (8) of the present invention is also provided with a facility to perform compression of IC packages (4) of differing thickness by adjusting at least a turning device (22) (hereinafter referred to as a Turner) provided thereat the hand socket lid (8) to control the protrusion (24) of the pressing member (18). This adjustment is manually carried out by turning the Turner (22) and does not require any additional tools or devices. This adjustable pedestal concept provides versatility in that customers who desire to test different package thickness can utilise the same test contactor and hand socket Lid (8) arrangement and does not require to purchase any additional tools or devices to effect adjustments to the pressing member (18).

While the preferred embodiment of the present invention and their advantages have been disclosed in the above Detailed Description, the invention is not limited thereto but only by the spirit and scope of the appended claim.

What is claimed is:

1. A hand socket lid for use in compressing electronic devices mounted on a test contactor, the hand socket lid comprising:
    at least a compressing mechanism having at least a lever member, at least a bearing member, and at least a pressing member, wherein the bearing member includes a periphery that comes into contact with a periphery of said lever member when the compressing mechanism is in a compression mode; and
    a latching device configured to secure the hand socket lid to the test contactor, the latching device including a vertical surface and a lateral surface, and the lateral surface including a step that defines a groove disposed between the vertical surface and the step.

2. A hand socket lid as in claim 1 wherein at least a turning device is provided to enable the pressing member to be adjusted.

3. A hand socket lid as in claim 2 wherein the pressing member is a heatsink or pedestal.

4. A hand socket lid as in claim 1 wherein a single hand is utilised for exerting, a compression force of over one hundred kilogrammes of force (kgf).

5. A hand socket lid as in claim 1 wherein the latching device is hook-like.

6. A hand socket lid as in claim 1, wherein the latching device is contactable with a plate of the hand socket lid.

7. A hand socket lid as in claim 6, wherein the plate of the hand socket lid includes at least a protruded portion that is engagable with the groove of the latching device.

8. A hand socket lid as in claim 7, wherein the groove of the latching device complements the protruded portion on the plate so that when engaged the groove and the protruded portion complementarily abut each other.

9. A hand socket lid as in claim 5 wherein the latching device is contactable with a plate of the hand socket lid.

10. A hand socket lid as in claim 9, wherein the groove of the latching device complements a protruded portion on the plate so that when the latching device and the plate are engaged, the groove and the protruded portion complementarily abut each other.

11. The hand socket lid of claim 1, wherein the periphery of the hearing member has a round shape.

12. A system for mounting and testing electronic devices, comprising:
    a test contactor including at least one cavity configured to receive the electronic devices;

a hand socket lid configured to compress the electronic devices against the test contactor, the hand socket lid including:
a compressing mechanism including:
a pressing member, a lever member, and a bearing member,
the bearing member is in contact with the pressing member,
the lever member and the bearing member each having a periphery that are contactable with each other, and
when the compression mechanism is in a compression mode, the periphery of the lever member and the periphery of the bearing member come into contact with each other, so as to move the pressing member towards the cavity; and
a plate disposed between the test contactor and the hand socket lid.

13. The system of claim 12, wherein the hand socket lid further includes a latching device configured to secure the hand socket lid to the test contactor, the latching device includes a vertical surface and a lateral surface, the lateral surface includes a step that defines a groove disposed between the vertical surface and the step, the plate of the socket lid includes a protruded portion, and the groove of the latching device and the protruded portion of the plate are configured to complementarily abut each other when the latching device and the plate are engaged.

14. The system of claim 12, wherein the periphery of the bearing member has a round shape.

15. The system of claim 13, wherein the latching device has a configuration akin to a clamshell.

16. The system of claim 12, wherein the plate is positioned at the hand socket lid.

* * * * *

UNITED STATES PATENT AND TRADEMARK OFFICE
CERTIFICATE OF CORRECTION

PATENT NO. : 8,523,591 B2  Page 1 of 1
APPLICATION NO. : 13/221385
DATED : September 3, 2013
INVENTOR(S) : Lim It is certified that error appears in the above-identified patent and that said Letters Patent is hereby corrected as shown below:

In the Claims

Column 4, line 63: delete "hearing" and insert --bearing--.

Signed and Sealed this
Twenty-first Day of October, 2014

Michelle K. Lee
*Deputy Director of the United States Patent and Trademark Office*